(12) United States Patent
Sato et al.

(10) Patent No.: US 8,222,749 B2
(45) Date of Patent: Jul. 17, 2012

(54) WIRING SUBSTRATE AND SEMICONDUCTOR DEVICE

(75) Inventors: Seiji Sato, Nagano (JP); Takashi Ozawa, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 12/254,382

(22) Filed: Oct. 20, 2008

(65) Prior Publication Data

US 2009/0102062 A1 Apr. 23, 2009

(30) Foreign Application Priority Data

Oct. 22, 2007 (JP) ................................. 2007-274011

(51) Int. Cl.
*H01L 23/48* (2006.01)
(52) U.S. Cl. .................. 257/784; 257/E23.02; 438/612
(58) Field of Classification Search .................. 257/737, 257/786, 784, 738, 774, 778, E29.014, E23.02; 438/445, 612
See application file for complete search history.

(56) References Cited

U.S. PATENT DOCUMENTS

| | | | | |
|---|---|---|---|---|
| 4,951,098 A * | 8/1990 | Albergo et al. | ................. | 257/48 |
| 5,160,409 A | 11/1992 | Moore et al. | ................. | 156/656 |
| 5,194,137 A * | 3/1993 | Moore et al. | ................. | 205/125 |
| 5,604,330 A * | 2/1997 | Hasan et al. | ................. | 174/542 |
| 5,818,114 A * | 10/1998 | Pendse et al. | ................. | 257/786 |
| 6,060,775 A * | 5/2000 | Ano | ................. | 257/693 |
| 6,127,196 A * | 10/2000 | Butera et al. | ................. | 438/15 |
| 6,229,711 B1 | 5/2001 | Yoneda | | |
| 6,504,239 B1 * | 1/2003 | Yamada | ................. | 257/678 |
| 6,509,643 B2 * | 1/2003 | Ohtaka et al. | ................. | 257/712 |
| 6,522,018 B1 * | 2/2003 | Tay et al. | ................. | 257/780 |
| 6,646,338 B2 * | 11/2003 | Hashimoto | ................. | 257/701 |
| 6,838,767 B2 * | 1/2005 | Hirano et al. | ................. | 257/737 |
| 6,909,184 B2 * | 6/2005 | Ushijima et al. | ................. | 257/739 |
| 7,061,093 B2 * | 6/2006 | Kimura et al. | ................. | 257/690 |
| 7,067,741 B2 * | 6/2006 | Hashimoto | ................. | 174/260 |
| 7,091,620 B2 * | 8/2006 | Miyazaki et al. | ................. | 257/778 |
| 7,269,028 B2 * | 9/2007 | Csonka et al. | ................. | 361/777 |
| 7,411,287 B2 * | 8/2008 | Ding | ................. | 257/692 |

(Continued)

FOREIGN PATENT DOCUMENTS

JP 05129366 A * 5/1993

(Continued)

OTHER PUBLICATIONS

Japanese Office Action mailed Nov. 15, 2011 in counterpart application No. 2007-274011 with partial English translation (4 pages.

*Primary Examiner* — William F Kraig
(74) *Attorney, Agent, or Firm* — Krtaz, Quintos & Hanson, LLP

(57) ABSTRACT

A wiring substrate of the present invention includes such a structure that a plurality of connection pads and leading wiring portions connected to the plurality of connection pads respectively are arranged to an insulating layer of a surface layer side, and the leading wiring portions are arranged to be bended from the connection pads, and a solder layer to protrude upward is provided on the connection pads respectively. A solder on the leading wiring portions moves to the bend portion side, and thus the solder layer to protrude upward is formed on the connection pads.

12 Claims, 12 Drawing Sheets

U.S. PATENT DOCUMENTS

| | | |
|---|---|---|
| 7,732,921 B2 * | 6/2010 | Fan et al. .................. 257/735 |
| 2002/0053732 A1 * | 5/2002 | Iwaya et al. ............... 257/723 |
| 2003/0030137 A1 * | 2/2003 | Hashimoto ................. 257/690 |
| 2003/0193089 A1 * | 10/2003 | Rumsey et al. ............. 257/738 |
| 2007/0241437 A1 * | 10/2007 | Kagaya et al. ............. 257/678 |
| 2008/0142993 A1 * | 6/2008 | Ozawa et al. .............. 257/778 |
| 2008/0160252 A1 * | 7/2008 | Leon et al. ................. 428/131 |
| 2008/0190654 A1 * | 8/2008 | Urano ........................ 174/255 |
| 2008/0223608 A1 | 9/2008 | Nishimura ................. 174/260 |
| 2010/0148172 A1 * | 6/2010 | Watanabe et al. .......... 257/48 |

FOREIGN PATENT DOCUMENTS

| | | |
|---|---|---|
| JP | 6-511353 | 12/1994 |
| JP | 7-94853 | 4/1995 |
| JP | 2000-77471 | 3/2000 |
| JP | 2004-40056 A1 | 2/2004 |
| JP | 3115062 | 9/2005 |
| JP | 2008-227050 | 9/2008 |

* cited by examiner

FIG. 7    comparison realizable pitch of prior art and embodiment (unit: μm)

| prior art | | | | embodiment | | | | | | | difference of realizable pitch to prior art | substrate L/S design rule | |
|---|---|---|---|---|---|---|---|---|---|---|---|---|---|
| realizable pitch =L+S+W1-W2 | L | S | WA-WB | realizable pitch | L2 =L1/cosθ | S2 =S1/cosθ | L1 | S1 | bending angle θ(°) | | | L | S |
| 50 | 20 | 20 | 10 | 40.16 | 20.08 | 20.08 | 20 | 20 | 5 | | -9.84 | 20 | 20 |
| | | | | 40.62 | 20.31 | 20.31 | 20 | 20 | 10 | | -9.38 | 20 | 20 |
| | | | | 41.40 | 20.70 | 20.70 | 20 | 20 | 15 | | -8.60 | 20 | 20 |
| | | | | 42.56 | 21.28 | 21.28 | 20 | 20 | 20 | | -7.44 | 20 | 20 |
| | | | | 44.14 | 22.07 | 22.07 | 20 | 20 | 25 | | -5.86 | 20 | 20 |
| | | | | 46.18 | 23.09 | 23.09 | 20 | 20 | 30 | | -3.82 | 20 | 20 |
| | | | | 48.82 | 24.41 | 24.41 | 20 | 20 | 35 | | -1.18 | 20 | 20 |
| | | | | 49.74 | 24.87 | 24.87 | 20 | 20 | 36.5 | | -0.26 | 20 | 20 |
| | | | | 52.20 | 26.10 | 26.10 | 20 | 20 | 40 | | +2.20 | 20 | 20 |
| | | | | 56.54 | 28.27 | 28.27 | 20 | 20 | 45 | | +6.55 | 20 | 20 |
| 40 | 15 | 15 | 10 | 30.12 | 15.06 | 15.06 | 15 | 15 | 5 | | -9.88 | 15 | 15 |
| | | | | 30.46 | 15.23 | 15.23 | 15 | 15 | 10 | | -9.54 | 15 | 15 |
| | | | | 31.06 | 15.53 | 15.53 | 15 | 15 | 15 | | -8.94 | 15 | 15 |
| | | | | 31.92 | 15.96 | 15.96 | 15 | 15 | 20 | | -8.08 | 15 | 15 |
| | | | | 33.10 | 16.55 | 16.55 | 15 | 15 | 25 | | -6.90 | 15 | 15 |
| | | | | 34.64 | 17.32 | 17.32 | 15 | 15 | 30 | | -5.36 | 15 | 15 |
| | | | | 36.62 | 18.31 | 18.31 | 15 | 15 | 35 | | -3.38 | 15 | 15 |
| | | | | 39.16 | 19.58 | 19.58 | 15 | 15 | 40 | | -0.84 | 15 | 15 |
| | | | | 39.74 | 19.87 | 19.87 | 15 | 15 | 41 | | -0.26 | 15 | 15 |
| | | | | 42.40 | 21.20 | 21.20 | 15 | 15 | 45 | | +2.40 | 15 | 15 |

WIRING SUBSTRATE AND SEMICONDUCTOR DEVICE

CROSS-REFERENCE TO RELATED APPLICATIONS

This application is based on and claims priority of Japanese Patent Application No. 2007-274011 filed on Oct. 22, 2007, the entire contents of which are incorporated herein by reference.

BACKGROUND OF THE INVENTION

1. Field of the Invention

The present invention relates to a wiring substrate and a method of manufacturing the same and a semiconductor device and, more particularly, a wiring substrate in which solder layers are provided on connection pads to which a semiconductor chip is flip-chip connected, and a method of manufacturing the same and a semiconductor device.

2. Description of the Related Art

In the prior art, a wiring substrate on which a semiconductor chip is flip-chip mounted is provided. As the approach of flip-chip mounting the semiconductor chip, there is such an approach that a solder is formed in advance on connection pads of the wiring substrate and then bumps of the semiconductor chip are joined to the connection pads of the wiring substrate via the solders. In order to attain sufficient joining strength between the bumps of the semiconductor chip and the connection pads of the wiring substrate, a sufficient volume of solder must be ensured on the connection pads of the wiring substrate.

In FIG. 1, a state of connection pads of a wiring substrate in the prior art is illustrated. As shown in FIG. 1, in a wiring substrate 100, a plurality of wirings 200 equipped with a connection pad 220 respectively are formed on an interlayer insulating layer 300, and a solder resist 400 in which an opening portion 400a is provided on an area that contains the connection pads 220 of a plurality of wirings 200 is formed.

Each of the wirings 200 exposed from the opening portion 400a of the solder resist 400 is constructed by the connection pad 220 arranged in a center portion, and a leading wiring portion 240 connected vertically to upper and lower ends of the connection pad 220 respectively. The leading wiring portion 240 together with the connection pad 220 is arranged linearly to extend in the same direction as the longitudinal direction of the connection pad 220. Also, a width WA of the connection pad 220 is set thicker than a width WB of the leading wiring portion 240.

Then, the protrusive solder layer is formed on the connection pads of the wiring substrate respectively. As the method of forming the solder layer, a solder is formed on the wirings 200 (the leading wiring portions 240 and the connection pads 220), which are exposed from the opening portion 400a of the solder resist 400, as a pattern and then a reflow heating is applied to the solder.

At this time, as shown in FIG. 2, when the solder is melted, the solder on the leading wiring portion 240 is moved onto the wide connection pad 220 by a surface tension of the solder. Thus, the solder is arranged concentratedly onto the connection pad 220. In this way, the solder layer having a required volume (shaded portion) is formed on the connection pad 220 to protrude upward.

As the similar technology, in Patent Literature 1 (Patent Application Publication (KOKAI) 2000-77471), it is set forth that, in the flip-chip mounting substrate on which an electronic component is mounted, the wiring pattern and the connection pads are exposed from openings of a solder resist, and a width of the connection pad is set larger than a width of the wiring pattern, and then solder bumps are formed while causing the solder on the wiring pattern to concentrate on the connection pad.

Also, in Patent Literature 2 (Patent Application Publication (KOKAI) 2004-40056), it is set forth that miniaturization of wiring patterns is attained by using curved bump receiving pads and straight pattern lines, and also respective exposed areas of the bump receiving pads are made equal by removing the resist, which is provided on the bump receiving pads and the pattern lines, in the same cylindrical shape, whereby a variation of height of the conductive bumps formed on the bump receiving pads is prevented.

In Patent Literature 3 (Patent Application Publication (KOKAI) Hei 7-94853), such a solder coating method is set forth that solder powders are adhered selectively to pre-coated portions of metal terminals of a printed-wiring board, then a flux is coated thereon, and then the solder powders are melted by the reflow heating.

In recent years, a pitch of the pads is narrowed along with performance enhancement of the semiconductor chip, and correspondingly a narrowing of a pitch of the connection pads of the wiring substrate is demanded. In the foregoing prior art, in order to arrange the solder stably on the connection pads 220 by utilizing a surface tension of the solder, the width WA of the connection pad 220 must be set thicker than the width WB of the leading wiring portion 240 by almost several tens µm.

This is because, unless the width WA of the connection pad 220 is not set sufficiently thicker than the width WB of the leading wiring portion 240, the solder is arranged in the position that is displaced from the center portion of the connection pad 220 or the height of the solders varies.

When a minimum pitch which can be formed is 40 µm (line:space=20 µm:20 µm) in forming the wirings of the wiring substrate, it is difficult to miniaturize the space. Therefore, the pitch of the wiring must be extended as much as the amount that the width of the connection pad becomes thick.

For example, in above FIG. 1, when the width WA of the connection pad 220 is set thicker than the width WB of the leading wiring portion 240 by 15 µm, even though the minimum pitch of the wirings which can be formed is 40 µm, the pitch of the wirings is increases to 55 µm (line:space=35 µm:20 µm).

This means that, unless an ability of the patterning technology based on the photography is improved, the patterning cannot respond to a narrow pitch smaller than the above. Thus, there is a problem that it can not easily respond to the further narrowing of the pitch of the pads of a semiconductor chip.

SUMMARY OF THE INVENTION

It is an object of the present invention to provide a wiring substrate capable of narrowing a pitch of connection pads, of wiring substrate for a flip-chip mounting, in which a solder is provided on the connection pads, and a method of manufacturing the same and a semiconductor device.

The present invention is concerned with a wiring substrate, which comprises a plurality of connection pads and leading wiring portions connected to said plurality of connection pads respectively, arranged to an insulating layer of a surface layer side, wherein the leading wiring portions are arranged to be bended from the connection pads, and a solder layer to protrude upward is provided on the connection pads.

The inventor of this application has found such a characteristic that the solder on the leading wiring portion moves toward the bending portion and concentrates there, in the method of arranging the solder to concentrate on the connection pads from the leading wiring portions by utilizing a surface tension. In the present invention, the leading wiring portion is provided to be bended from the connection pad by utilizing this principle. By this matter, the solder on the leading wiring portion is forced to concentrate on the connection pad.

Like the prior art, in the method of forming the connection pads by thickening a part of width of the linear wiring, the width of the connection pad must be set thicker than the width of the leading wiring portion by several tens μm. Therefore, this method cannot easily respond to a narrowing of a pitch.

However, in the present invention, such a characteristic is utilized that the solder concentrates on the bending portion of the wiring. Therefore, a pitch of the leading wiring portions may be set to a realizable minimum pitch, and the connection pad may be provided on the bending portion side. As a result, only the width of the connection pad should be thickened by a length that corresponds to the bending angle of the leading wiring portion, and therefore a pitch of the connection pads can be narrowed in contrast to the prior art. Also, the solder on the leading wiring portion can be arranged stably concentratedly on the connection pad.

In one mode of the present invention, the connection pads and the leading wiring portions may be arranged on the insulating layer in a state that the connection pads and the leading wiring portions are exposed from the opening portion in the uppermost protection insulating layer (solder resist). Otherwise, the connection pads and the leading wiring portions may be embedded in the insulating layer while omitting the protection insulating layer such that the upper surfaces of the connection pads and the leading wiring portions are exposed.

Also, the present invention is concerned with a method of manufacturing a wiring substrate, which comprises the steps of: preparing a wiring substrate which has a structure in which a plurality of connection pads and leading wiring portions connected to said plurality of connection pads respectively are arranged to an insulating layer of a surface layer side, and the leading wiring portions are arranged to be bended from the connection pads; forming a solder on the connection pads and the leading wiring portions; and forming a solder layer to protrude upward on the connection pads by applying a reflow heating to the solder such that the solder formed on the leading wiring portions is moved and concentrated onto the connection pads.

The above wiring substrate can be manufactured easily by using the method of manufacturing the wiring substrate of the present invention. In a preferred mode of the present invention, a bending angle of the leading wiring portion to the connection pad is adjusted such that a pitch of the connection pads is set smaller than a predetermined dimension.

As explained above, in the present invention, in the wiring substrate in which the solder is provided on the connection pads, a pitch of the connection pads can be narrowed rather than the prior art, and also the solder can be arranged stably on the connection pads to concentrate there.

BRIEF DESCRIPTION OF THE DRAWINGS

FIG. 7 is a view for comparing realizable pitches in tabular form in the connection pads of the wiring substrate according to the first embodiment of the present invention and the connection pads of the wiring substrate in the prior art;

DETAILED DESCRIPTION OF THE PREFERRED EMBODIMENTS

Embodiments of the present invention will be explained with reference to the accompanying drawings hereinafter.

(First Embodiment)

Figure 3:
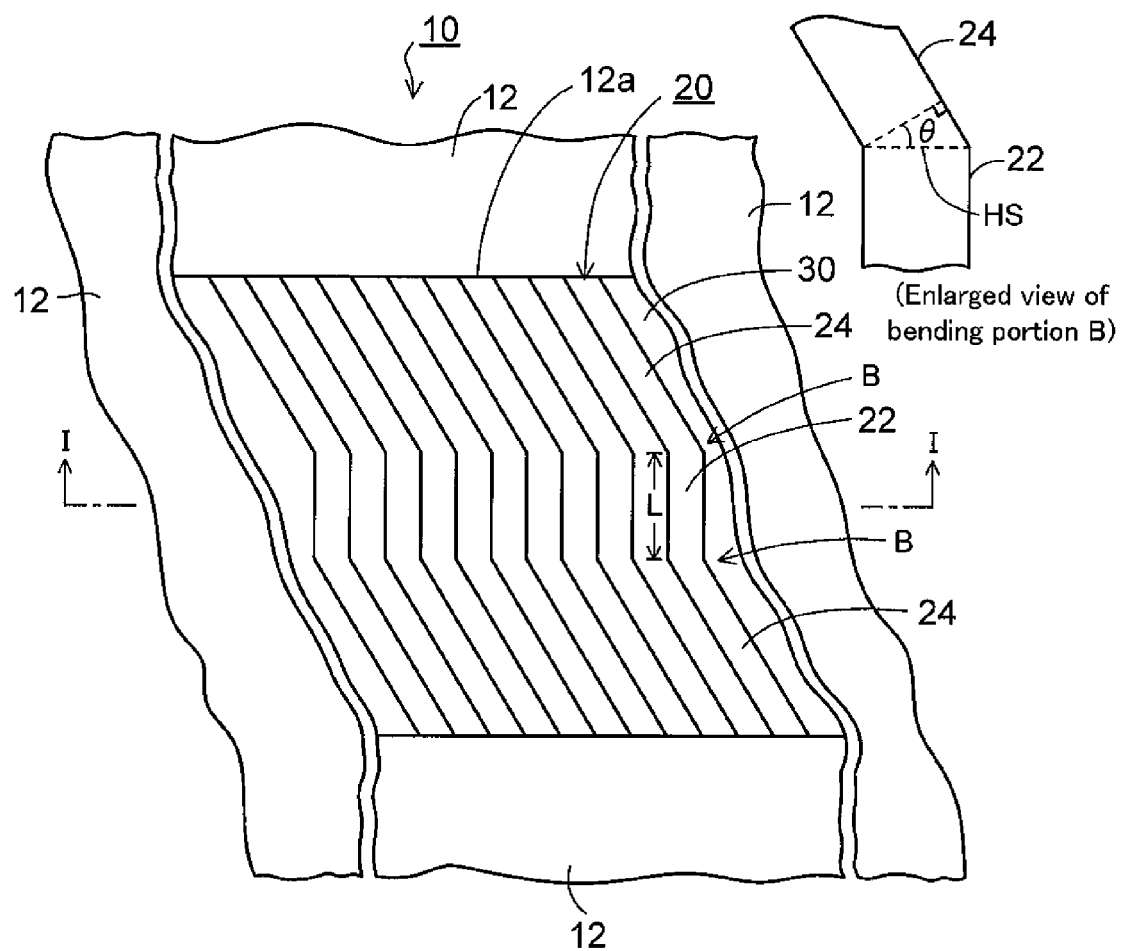
FIG. 3 is a plan view showing connection pads of a wiring substrate according to a first embodiment of the present invention.
Figure 4A:
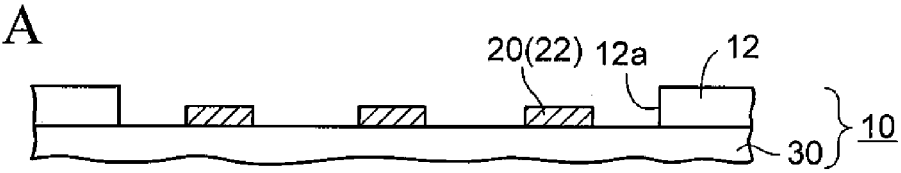
FIGS. 4A to 4D are sectional views (#1) showing a method of forming a solder layer on the connection pads of the wiring substrate according to the first embodiment of the present invention.
Figure 4B:
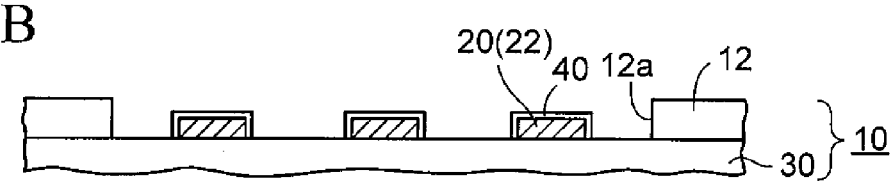
Figure 4C:
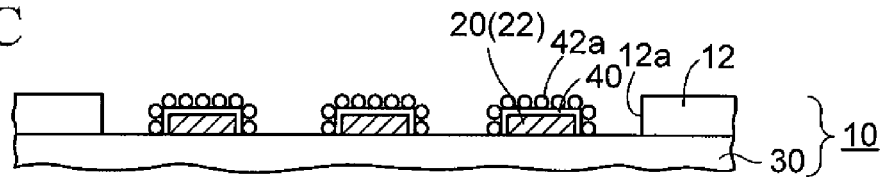
Figure 4D:
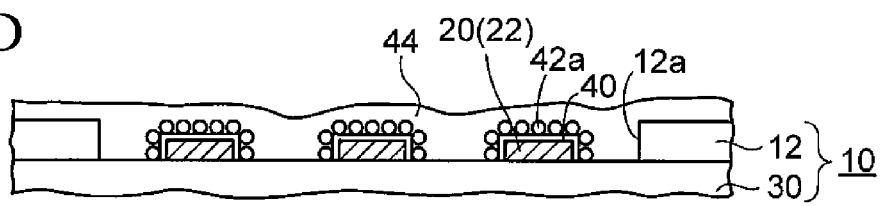
Figure 5:
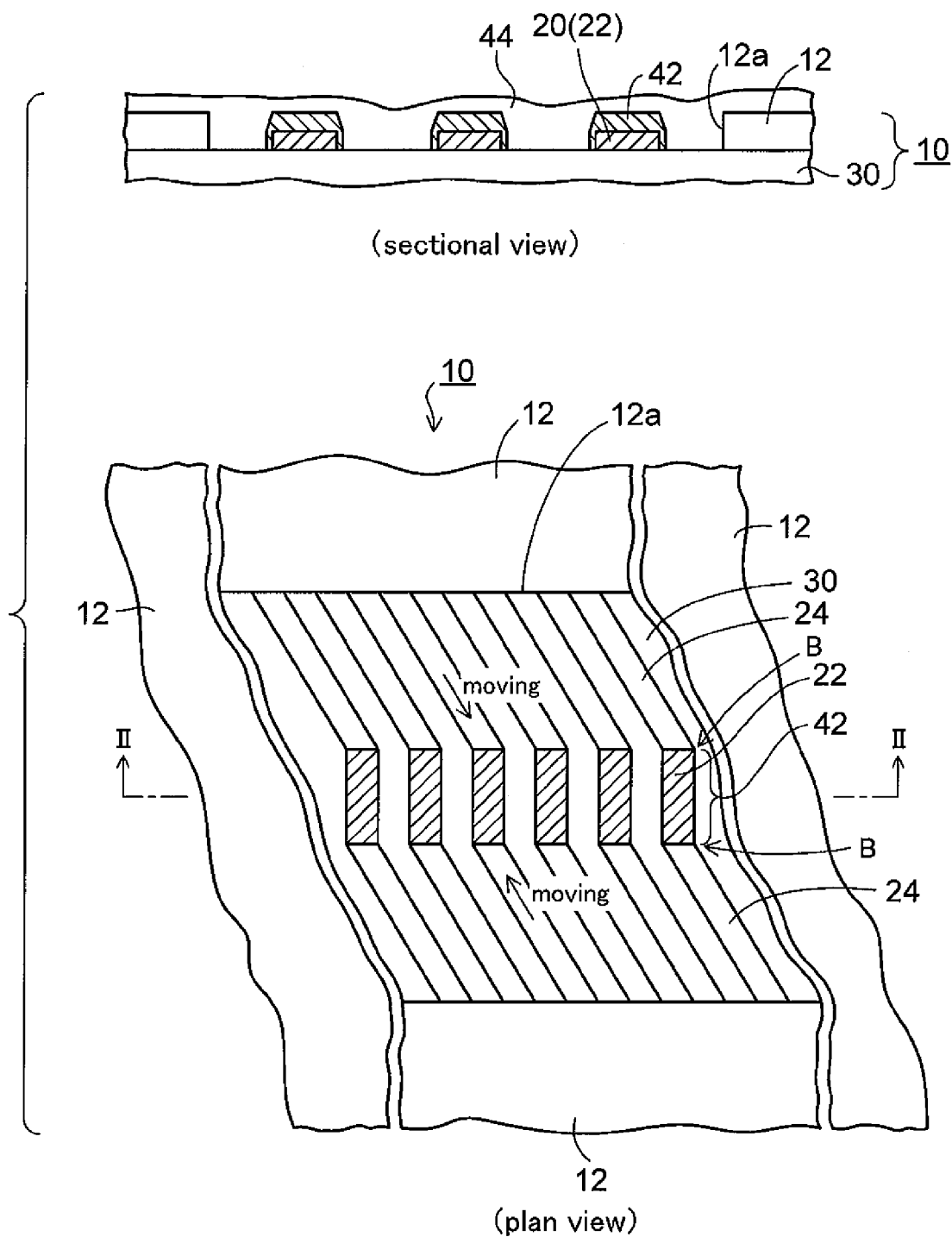
FIG. 5 is a sectional view and a plan view (#2) showing the method of forming the solder layer on the connection pads of the wiring substrate according to the first embodiment of the present invention.
Figure 6:
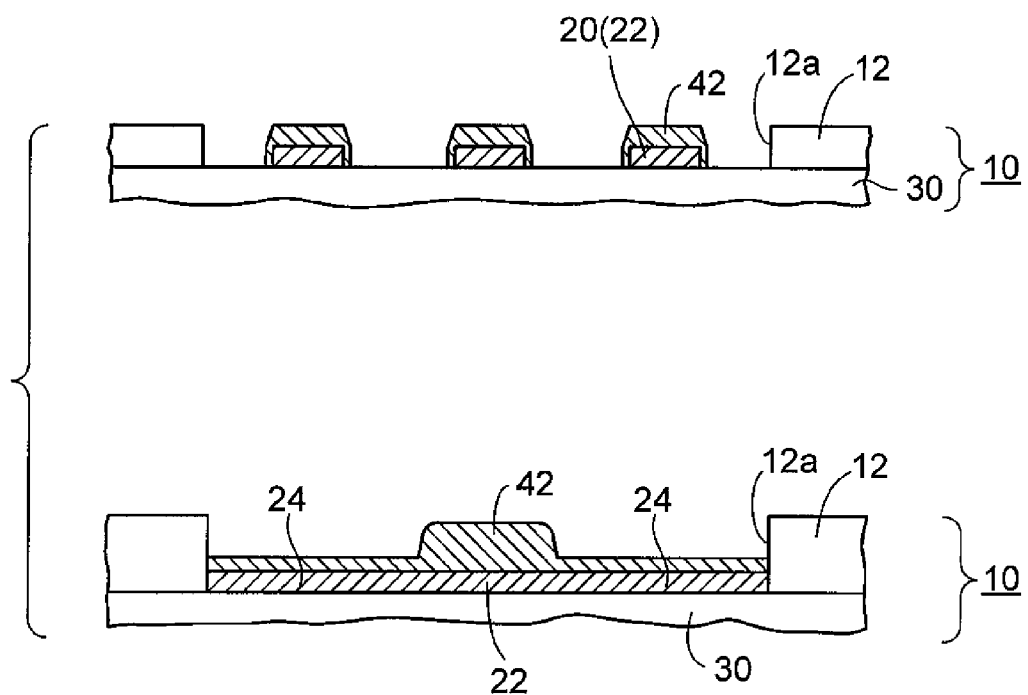
FIG. 6 is a sectional view (#3) showing the method of forming the solder layer on the connection pads of the wiring substrate according to the first embodiment of the present invention.

FIG. 3 is a plan view showing connection pads of a wiring substrate according to a first embodiment of the present invention, and FIG. 4 to FIG. 6 are a plan view and a sectional view showing a method of forming a solder layer on the connection pads of the wiring substrate similarly.

As shown in FIG. 3, in a wiring substrate 10 of the first embodiment, a solder resist 12 (protection insulating layer) is provided to the uppermost layer, and a plurality of wirings 20 formed on an interlayer insulating layer 30 are exposed from an opening portion 12a thereof. Each of the wirings 20 exposed from the opening portion 12a in the solder resist 12 is constructed by a connection pad 22 arranged in a center portion, and a leading wiring portion 24 extended and bended from upper and lower end portions of the connection pad 22 respectively.

The connection pad 22 is formed like a rectangle whose long side has a length L (e.g., 50 to 150 μm), and is arranged to direct its longitudinal direction toward the vertical direction. In contrast, the upper-side leading wiring portion 24 is arranged to be bend leftward at a bending angle θ from a horizontal side HS (see an enlarged view) as an upper side of the connection pad 22. Similarly, the lower-side leading wiring portion 24 is arranged to be bend rightward at a bending angle θ from a horizontal side as a lower side of the connection pad 22.

In this manner, in the first embodiment, the leading wiring portion 24 is extended to be bended from both end portions of the connection pad 22 respectively, and the connection pad 22 is arranged between two bending portions B.

The inventor of this application has studied earnestly the method that arranges the solder on the connection pads concentratedly from the leading wiring portions by utilizing a surface tension. As the result of this study, the inventor of this application has found such a characteristic that the solder on the leading wiring portion 24 moves toward the bending portion B and concentrates there.

As explained later, the portion located between the bending portions B is used as the connection pad 22. Therefore, a pitch of the connection pads can be narrowly than the method of the prior art in which the connection pads are composed by thickening a part of width of the linear wirings, and also the solder can be arranged stably on the connection pads to concentrate there.

Next, a method of forming the solder layer on the connection pads of the wiring substrate of the present embodiment will be explained hereunder. First, the wiring substrate 10 shown in FIG. 4A is prepared. FIG. 4A shows schematically an upper side from the interlayer insulating layer 30 under the wirings 20 among a cross section of the wiring substrate 10 which is taken along I-I in FIG. 3 (sectional portions of the connection pads 22).

In FIG. 4A, the connection pads 22 are illustrated as the uppermost wirings 20. The wiring 20 is formed of a metal such as copper, or the like, and the interlayer insulating layer 30 is formed of resin, or the like.

The solder resist 12 (protection insulating layer) in which the opening portion 12a is provided is formed to the uppermost portion of the wiring substrate 10. A plurality of wirings 20 (the connection pads 22 and the leading wiring portions 24) (FIG. 3) are exposed from the opening portion 12a of the solder resist 12.

Here, in FIG. 3 and FIG. 4A, such a mode may be employed that the solder resist 12 is omitted. Otherwise, such a mode may be employed that the solder resist 12 is omitted and the wirings 20 are embedded in the interlayer insulating layer 30 such that upper surfaces of the wirings 20 and the upper surface of the interlayer insulating layer 30 constitute the identical surface. That is, in this case, only the upper surfaces of the wirings 20 are exposed from the upper surface side of the interlayer insulating layer 30, and the side surfaces and the lower surfaces are embedded in the interlayer insulating layer 30.

Also, various substrates may be employed as the wiring substrate 10 if such substrate can be used as the flip-chip mounting wiring substrate.

Then, as shown in FIG. 4B, an adhesive layer 40 is formed on the wirings 20 (the connection pads 22 and the leading wiring portions 24) (FIG. 3) exposed from the opening portion 12a of the solder resist 12. The adhesive layer 40 can be formed selectively on the wirings 20 by dipping the structure in FIG. 4A into a liquid that can form an adhesive agent selectively only on the surface of the metal. As an example, the adhesive layer 40 is formed of an imidazole-based organic film.

Then, as shown in FIG. 4C, a large number of solder powders 42a are stuck to the adhesive layers 40 on the wirings 20 (the connection pads 22 and the leading wiring portions 24)(FIG. 3). Thus, the wirings 20 are coated with the solder powders 42a respectively. As the material of the solder powders 42a, for example, a tin (Sn)-silver (Ag) solder is employed. At this time, the unnecessary solder powders 42a stuck onto the interlayer insulating layer 30 and the solder resist 12 by a static electricity, or the like are removed.

Then, as shown in FIG. 4D, a flux 44 is coated on the wirings 20 on which the solder powders 42a are stuck. Then, the reflow heating is applied to the solder powders 42a at a reflow temperature that meets a composition of the solder. At this time, an oxide layer formed on surfaces of the solder powders 42a is removed by the flux 44, and also a large number of solder powders 42a are melted and united together.

Also, at this time, as shown in a plan view of FIG. 5, the solder powders 42a stuck on the leading wiring portion 24 connected to the upper and lower sides of the connection pad 22 move toward the bending portion B side by a surface tension of the solder at a time of melting thereof. Accordingly, the solder is arranged concentratedly on the connection pads 22. This is because, as described above, the solder on the wiring has the characteristic to move toward the bending portion B side at a time of melting thereof.

In this manner, as shown in a sectional view and a plan view of FIG. 5, a solder layer (solder bump) 42 having a sufficient volume (shaded portion in a plan view in FIG. 5) is formed on the connection pads 22 respectively to protrude upward. A sectional view of FIG. 5 illustrates schematically a cross section taken along II-II in an underlying plan view.

A volume (amount or height) of the solder layer 42 can be adjusted by controlling a diameter of the solder power 42a or a length (area) of the connection pad 22 or the leading wiring portion 24. A height of the solder layer 42 formed on the connection pad 22 is set to 10 to 30 μm, for example, and is adjusted appropriately in response to the specification of the semiconductor chip which is flip-chip mounted.

Here, the solder power 42a is used as the material of the solder layer 42. In this case, a solder paste may be formed on the wirings 20 by the screen printing, or the like, otherwise the solder may be formed on the wirings 20 by the electroplating. Then, the reflow heating is similarly applied to the solder paste or the solder plating layer.

Then, as shown in an upper view of FIG. 6, a residue of the flux 44 on the upper surface of the wiring substrate 10 is removed by the cleaning. A lower view of FIG. 6 is a fragmental sectional view taken along a center portion of the connection pad 22 and the leading wiring portion 24 in the width direction. As shown in a lower view of FIG. 6, most of the solder on the leading wiring portion 24 concentrates on the connection pad 22 and thus the solder layer 42 (bump) is formed to protrude upward, but the solder still remains on the leading wiring portion 24 in a thin film state.

With the above, the solder layer 42 is formed to protrude upward on the connection pads 22 of the wiring substrate 10 respectively, and thus the flip-chip mounting wiring substrate 10 is obtained.

In the present embodiment, the approach of causing the solder to concentrate on the connection pads 22 by arranging the leading wiring portions 24 while bending from the connection pads 22 is employed. As a result, a width of the connection pads 22 can be reduced rather than the prior art, and a pitch of the connection pads 22 can be narrowed.

In the structure (FIG. 3) in the present embodiment in which the leading wiring portions 24 are bended from the connection pads 22, the inventor of this application has compared a pitch of the connection pads obtained by changing the bending angle θ (FIG. 3) of the leading wiring portions 24, and a pitch of the connection pads in the prior art.

Figure 1:
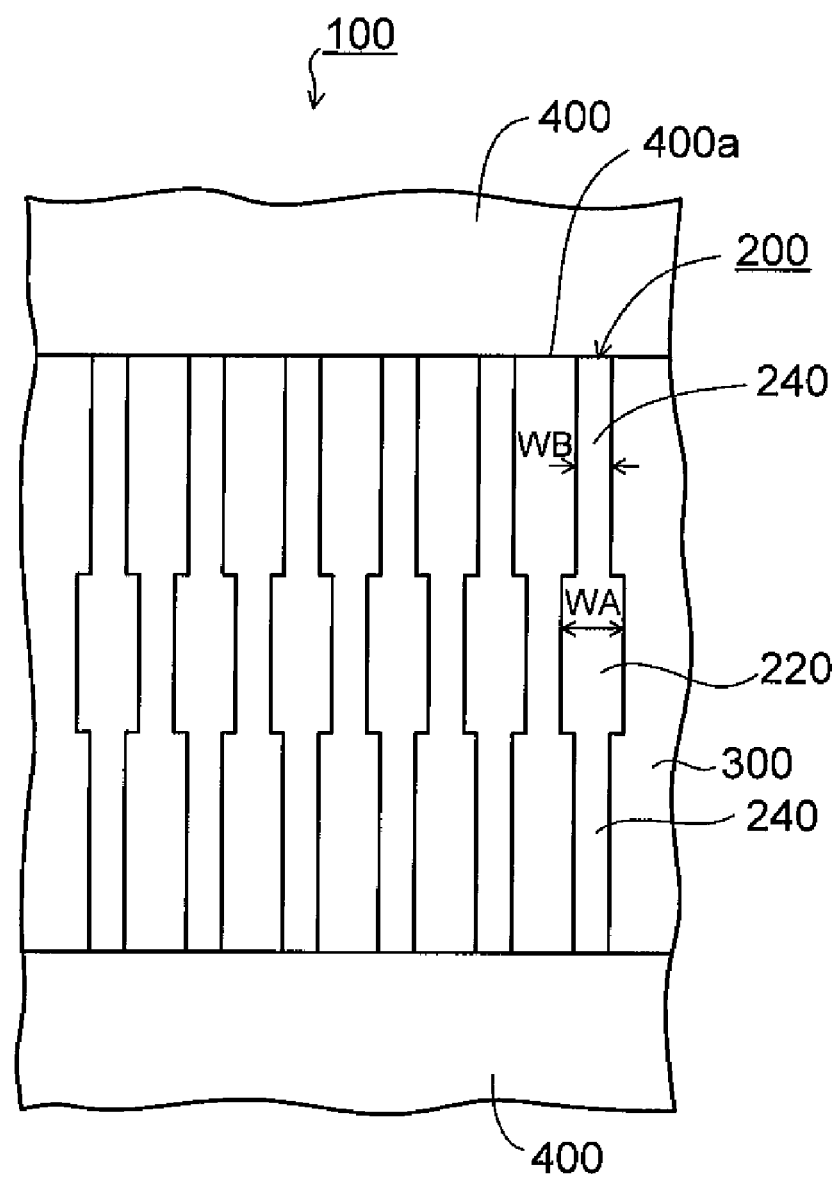
FIG. 1 is a plan view showing connection pads of a wiring substrate in the prior art.
Figure 2:
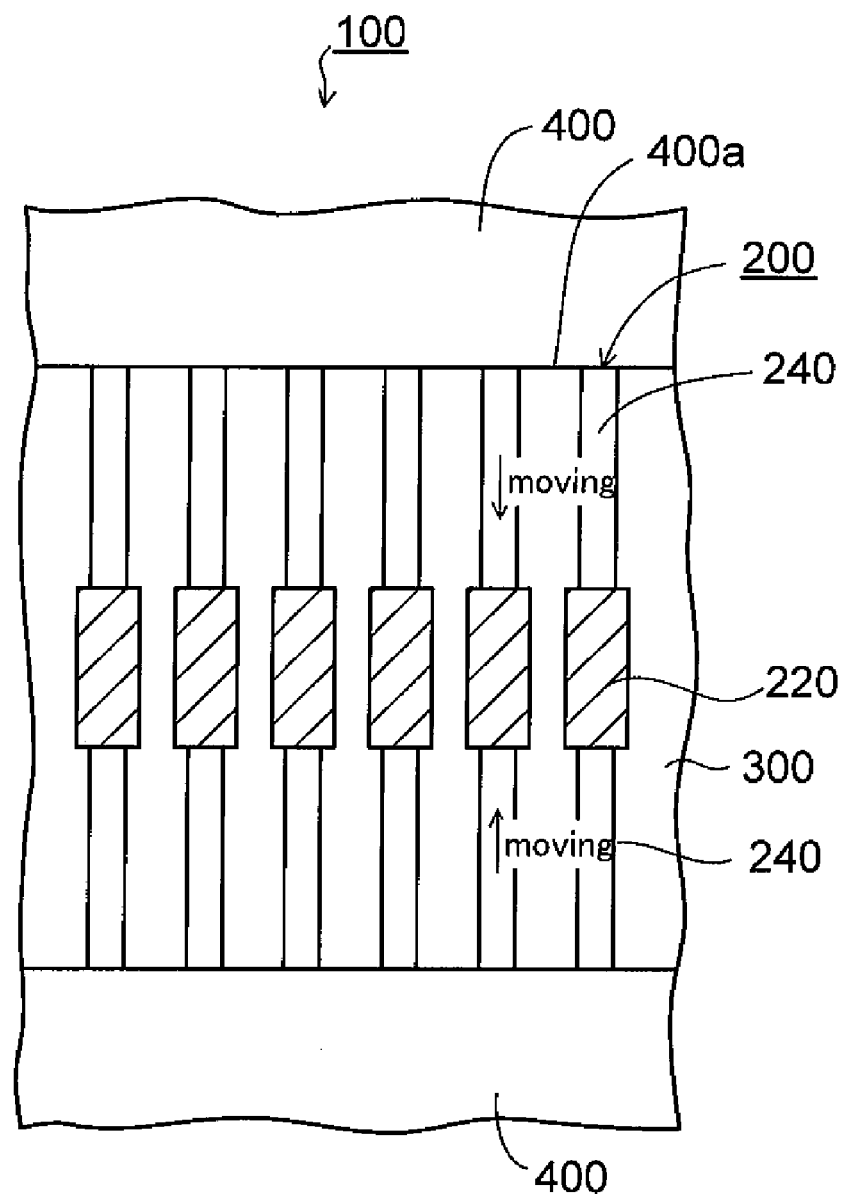
FIG. 2 is a plan view showing a state in which a solder layer is formed on the connection pads of the wiring substrate in the prior art respectively.

FIG. 7 is a view for comparing realizable pitches in tabular form in the connection pads of the wiring substrate according to the first embodiment of the present invention and the connection pads of the wiring substrate in the prior art As shown in FIG. 7, the case where a pitch 40 μm (line (L):space (S)=20 μm:20 μm) and a pitch 30 μm (line (L):space (S)=15 μm:15 μm) are assumed as a design rule (realizable minimum pitch) of the wiring substrate. Also, in the prior art (see FIG. 1), the case where the width WA of the connection pad is set thicker than the width WB of the leading wiring portion by 10 μm is assumed.

At first, the case where a design rule of L/S of the wiring substrate is a pitch 40 μm (L:S=20 μm:20 μm) will be explained hereunder. In this case, in the prior art (see FIG. 1), when the width WA of the connection pad 220 is thickened by 10 μm, a realizable pitch becomes 50 μm (L(20 μm)+S(20 μm)+WA(30 μm)−W2(20 μm)).

Figure 8:
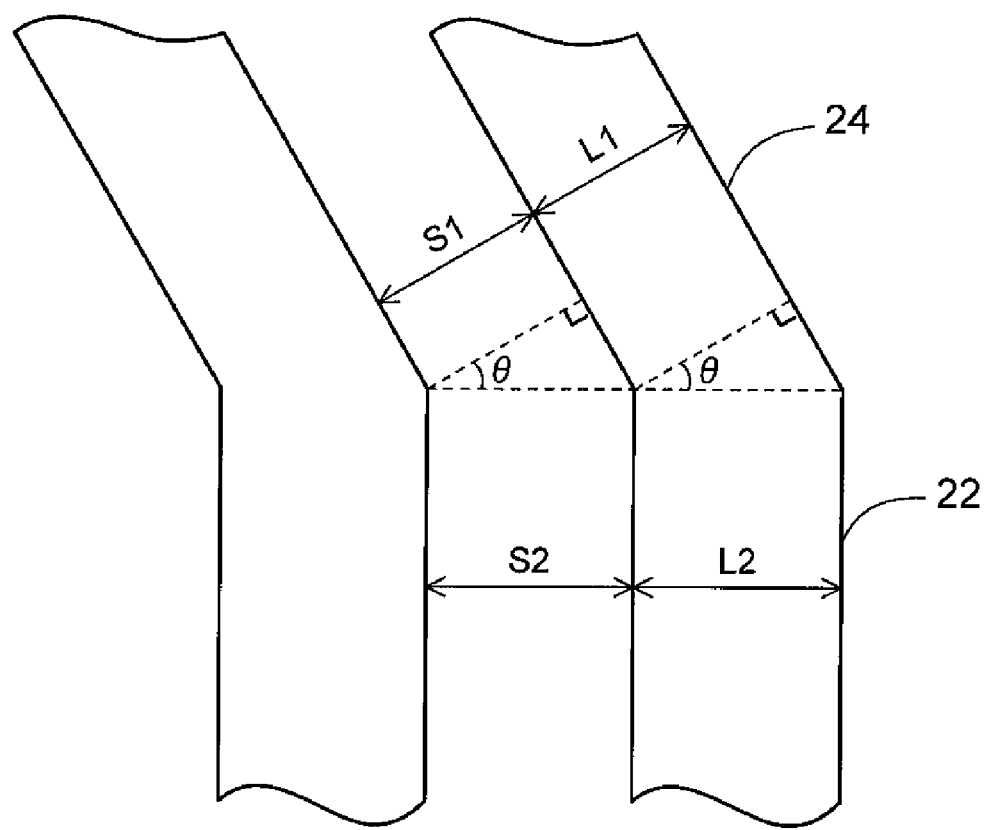
FIG. 8 is a supplementary view explaining a calculation formula applied to calculate line and space widths of the connection pads from line and space widths of leading wiring portions in FIG. 7.

In contrast, a comparison of a pitch of the connection pads 22 of the present embodiment is made hereunder. As shown in FIG. 7, first, respective widths of line (L2): space (S2) of the connection pads 22 upon forming the leading wiring portions 24 at a minimum pitch 40 μm (line (L1):space (S1)=20 μm:20 μm) will be calculated hereunder. By reference to FIG. 8, a width of the line (L2) of the connection pad 22 is calculated by a calculation formula of line (L1) of the leading wiring portion 24/cos θ. Similarly, a width of the space (S2) between the connection pads 22 is calculated by a calculation formula of space (S1) of the leading wiring portion 24/cos θ.

In a case where line (L1): space (S1) of the leading wiring portions 24 are formed at a minimum pitch of 20 μm:20 μm, on based on this calculation formula, it is calculated how the widths of line (L1):space (S1) of the connection pads 22 are changed depending upon the bending angle θ. A value that the width of line (L2) and the width of space (S2) of the connection pads 22 are added corresponds to a realizable pitch of the connection pads 22 in the present embodiment.

As shown in FIG. 7, respective widths of the line (L2): space (S2) of the connection pads 22 are increased as the bending angle θ of the leading wiring portion 24 is increased. The bending angle θ at which a pitch becomes smaller than the realizable pitch (50 μm) in the prior art is 36.5° or less. For example, when the bending angle θ is 25°, the realizable pitch becomes 44.14 μm. Thus, a pitch can be made smaller than the realizable pitch (50 μm) in the prior art by 5.86 μm. In this manner, it is understood that, when a design rule of the wiring substrate is a pitch 40 μm (L:S=20 μm:20 μm), the pitch of the connection pads 22 can be made narrower than the prior art until the bending angle θ reaches about 36°.

The inventor of this application has prepared test samples in which the bending angle θ of the leading wiring portion 24 is changed respectively, and then formed the solder layer on the connection pads 22 by the above mentioned method. According to the result, it was found that, when the bending angle θ of the leading wiring portion 24 is 20° or more, the solder layer can be formed in the center portion of the connection pad 22, and a variation in height of the solder layer can be suppressed within a specification range, and therefore the solder layer can be formed stably with good yield. However, when the bending angle θ of the leading wiring portion 24 falls below 20°, sometimes the solder layer is slightly displaced from the center portion of the connection pad 22 or a variation in height of the solder layer is increased.

Accordingly, it is preferable that, when a pitch of the leading wiring portions 24 is 40 μm, the bending angle θ of the leading wiring portion 24 should be set in a range from 20°, at which the solder layer can be formed satisfactorily, to 36.5°, at which the realizable pitch can be narrowed rather than the prior art. By setting the bending angle θ of the leading wiring portion 24 to this range, the realizable pitch of the connection pads can be narrowed rather than the prior art, and also the solder layer can be arranged stably in the center portions of the connection pads by a surface tension not to cause a variation in height.

Next, the case where a design rule of the wiring substrate is set to a pitch 30 μm (L:S=15 μm:15 μm) will be explained hereunder. In this case, in the prior art, when the width WA of the connection pad 220 is thickened by 10 μm, the realizable pitch becomes 40 μm (L(15 μm)+S(15 μm)+WA(25 μm)−W2 (15 μm)).

Then, the line (L2): space (S2) of the connection pads 22 to the bending angle θ of the leading wiring portion 24 are calculated similarly by the above calculation formula.

Respective widths of the line (L2):space (S2) of the connection pads 22 are increased as the bending angle θ of the leading wiring portion 24 is increased. The bending angle θ at which a pitch becomes smaller than the realizable pitch (40 μm) in the prior art is 41° or less. For example, when the bending angle θ is 25°, the realizable pitch becomes 33.1 μm. Thus, the pitch can be made narrower than the realizable pitch (40 μm) in the prior art by 6.9 μm.

In this manner, it is understood that, when a design rule of the wiring substrate is a pitch 30 μm (L:S=15 μm:15 μm), a pitch of the connection pads 22 can be made narrower than the prior art until the bending angle θ reaches about 41°.

As described above, by causing the leading wiring portion 24 connected to the connection pad 22 to bend, the solder on the leading wiring portion 24 can concentrate on the connection pad 22 by a surface tension and can be arranged stably there. In addition, unlike the prior art, there is no need that the line width of the connection pad 22 should be set thicker than the line width of the leading wiring portion 24 by almost several tens μm. Merely the line width of the connection pad 22 is thickened in response to the bending angle θ of the leading wiring portion 24. For example, when the bending angle θ of the leading wiring portion 24 is 35°, in the case where a design rule of the wiring substrate has a pitch 40 μm, merely the line width of the connection pad 22 becomes thicker than the leading wiring portion 24 by about 4.4 μm.

In the prior art, it was confirmed that, when the line width of the connection pad 22 is merely made thicker than the leading wiring portion 24 by about 4.4 μm, the solder does not well concentrate on the connection pad and a height is varied considerably. Therefore, it is appreciated that the method of causing the leading wiring portion 24 to bend from the connection pad in the present embodiment is valuable.

Figure 9:
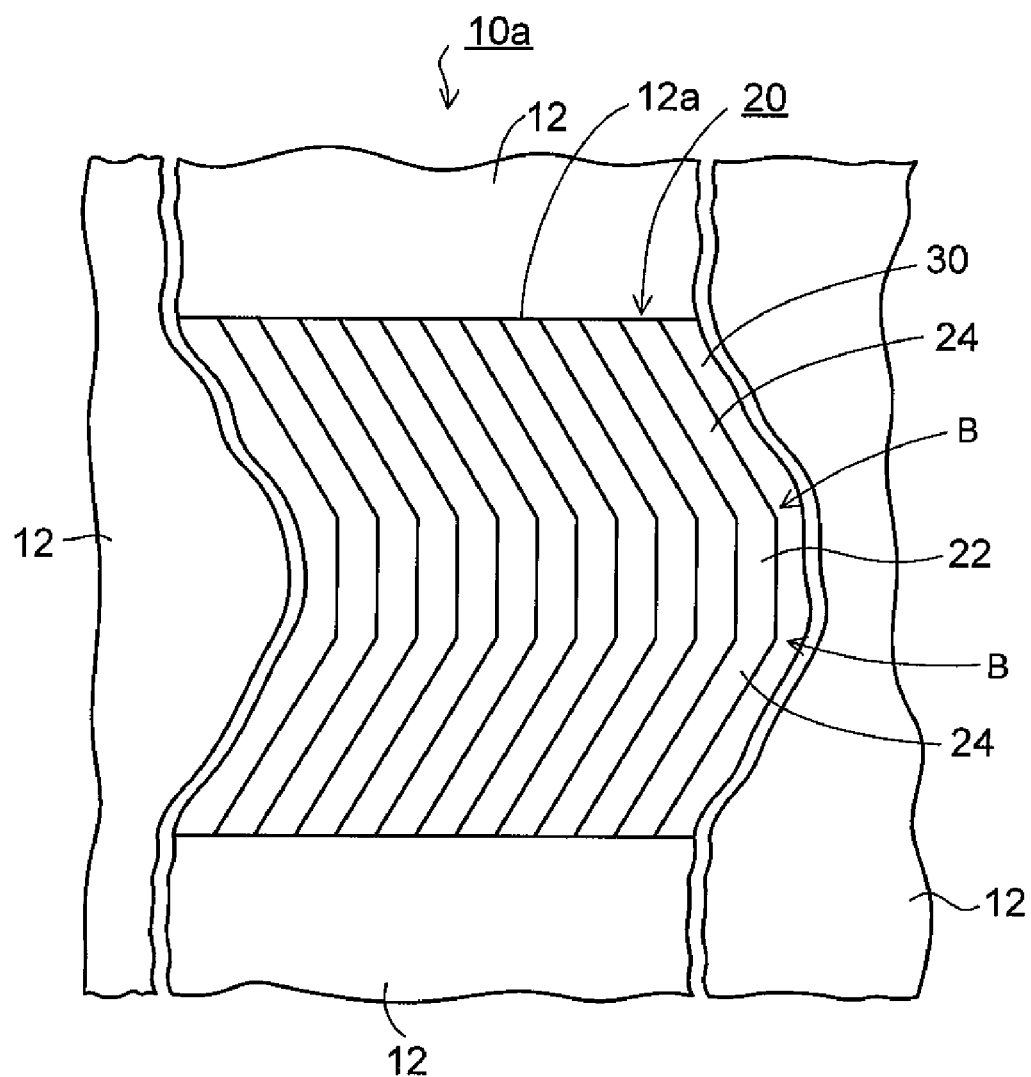
FIG. 9 is a plan view showing connection pads of a wiring substrate according to a first variation of the first embodiment of the present invention.

In FIG. 9, connection pads of a wiring substrate according to a first variation of the first invention are shown. In FIG. 3 mentioned above, the leading wiring portion 24 connected to the upper side of the connection pad 22 is bended leftward from the perpendicular direction to constitute the bending portion B, while the leading wiring portion 24 connected to the lower side of the connection pad 22 is bended rightward from the perpendicular direction to constitute the bending portion B.

As shown in FIG. 9, in a wiring substrate 10a of the first variation, the leading wiring portions 24 connected to the upper and lower sides of the connection pads 22 are bended leftward from the perpendicular direction respectively. That is, the leading wiring portions 24 connected to the upper and lower sides of the connection pads 22 are arranged symmetrically as an axis in a center portion of the connection pad 22.

Figure 10:
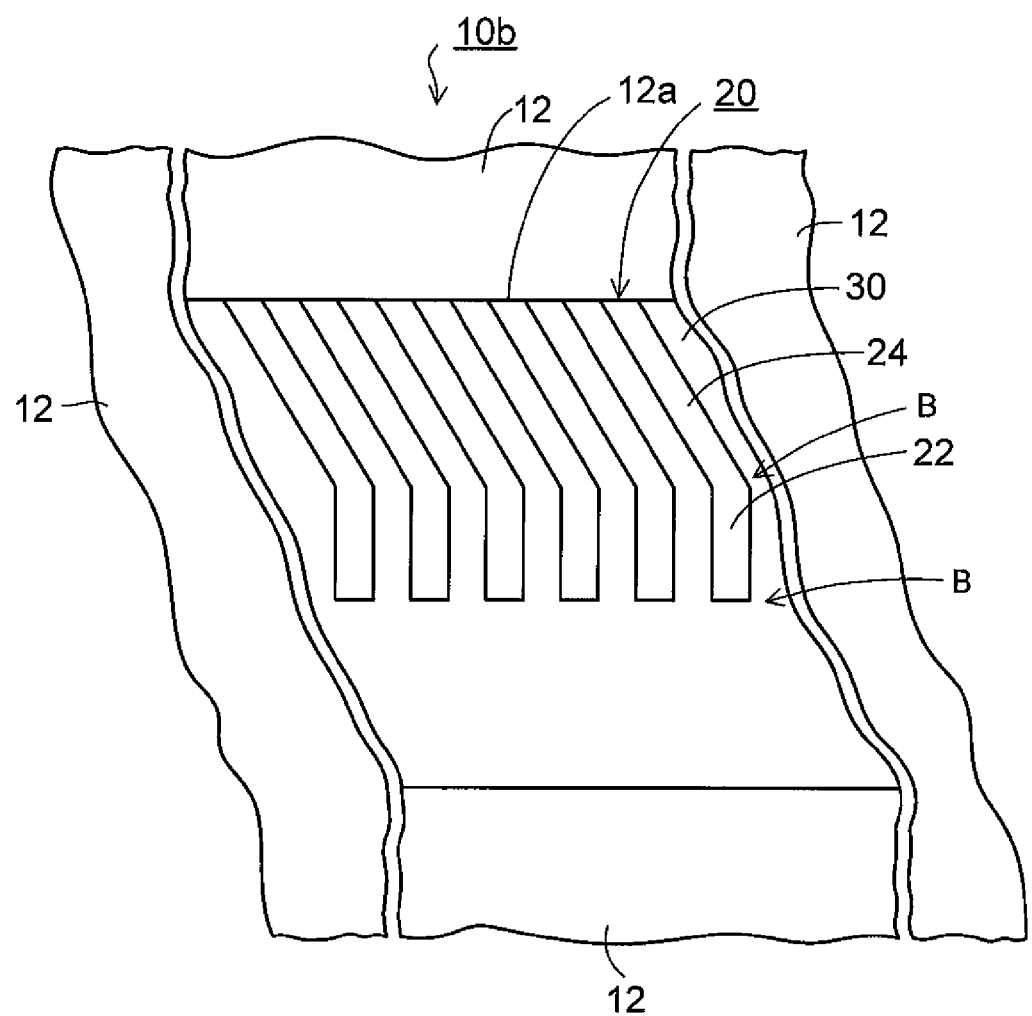
FIG. 10 is a plan view showing connection pads of a wiring substrate according to a second variation of the first embodiment of the present invention.

Also, in FIG. 10, connection pads of a wiring substrate according to a second variation of the first embodiment are shown. Like a wiring substrate 10b of the second variation shown in FIG. 10, the leading wiring portion 24 may be connected to be bended only to the upper side of the connection pad 22. That is, in the present embodiment, the connection pad 22 may be connected to two bended leading wiring portions 24 and may be put between two bending portions B, or the bended leading wiring portion 24 may be connected only to one end of the connection pad 22.

Since remaining elements in FIG. 9 and FIG. 10 are identical to those in FIG. 3, their explanation will be omitted herein by affixing the same reference symbols. In the first and second variations in FIG. 9 and FIG. 10, the same advantages as those of the wiring substrate 10 in FIG. 3 can be achieved.

Figure 11A:
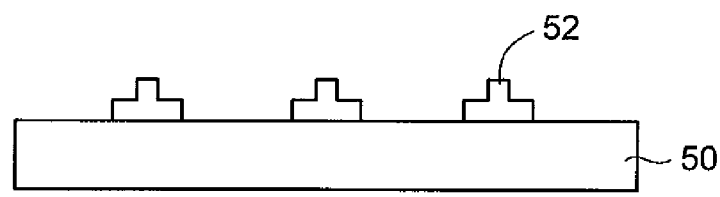
FIGS. 11A to 11C are sectional views a method of flip-chip connecting a semiconductor chip to the connection pads of the wiring substrate and a method of obtaining a semiconductor device according to the first embodiment of the present invention.

Next, a method of flip-chip connecting a semiconductor chip to the connection pads 22 of the wiring substrate 10 will be explained hereunder. As shown in FIG. 11A, a semiconductor chip 50 (LS1 chip) having gold bumps 52 thereon is prepared. In an example in FIG. 11A, bumps formed by a wire bonding method are illustrated as the gold bumps 52 of the semiconductor chip 50. In this case, the semiconductor chip 50 having various metal bumps such as solder bumps, and the like in addition to the gold bumps 52 may be employed.

Figure 11B:
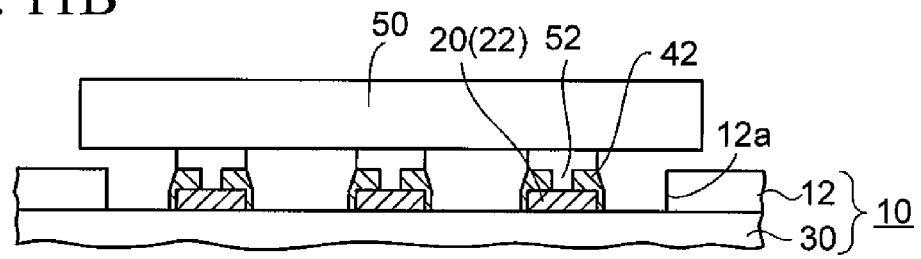

Then, as shown in FIG. 11B, the gold bumps 52 of the semiconductor chip 50 are arranged on the solder layers 42 on the connection pads 22 of the above wiring substrate 10, and then the semiconductor chip 50 is bonded to the wiring substrate 10 side while applying a heating and a pressure. Accordingly, the gold bumps 52 of the semiconductor chip 50 are flip-chip connected to the connection pads 22 of the wiring substrate 10 via the solder layer 42.

Figure 11C:
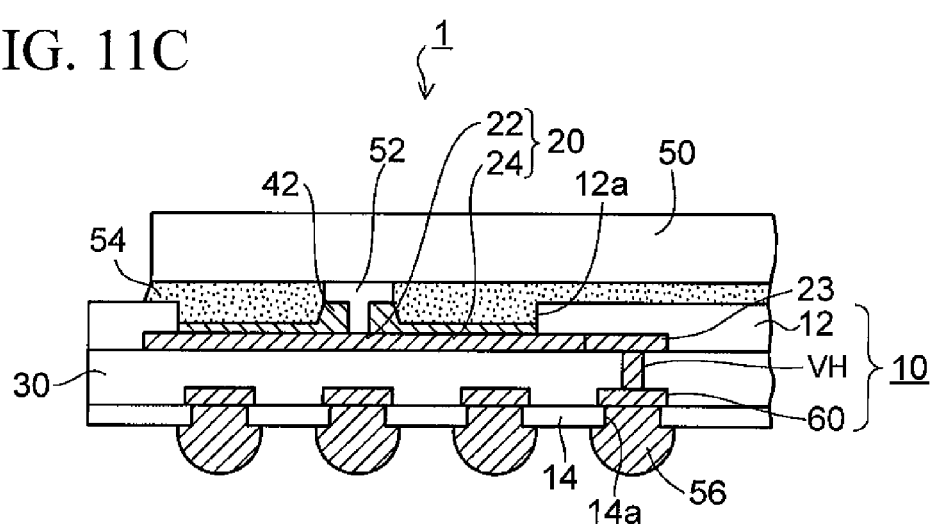

FIG. 11C is a sectional view when the structure in FIG. 11B is cut along the center of the wirings 20 in the width direction, and the whole wiring substrate 10 in the thickness direction is schematically shown. As shown in FIG. 11C, a land 23 connected to the wiring 20 is formed on one end side of the wiring 20 of the wiring substrate 10. Also, the land 23 is connected to the lowermost wiring that contains connection portions 60, which are formed on the lower surface of the interlayer insulating layer 30, via via holes VH which are provided in the interlayer insulating layer 30 and into which the through electrode is filled. Also, a solder resist 14 in which opening portions 14a are provided on the connection portions 60 of the lowermost wiring is formed on the lower surface side of the wiring substrate 10.

Also, an underfill resin 54 is filled in a clearance between the wiring substrate 10 and the semiconductor chip 50. Also, external connection terminals 56 are formed on the lower surface side of the wiring substrate 10 by mounting a solder ball on the connection portions 60 of the lowermost wiring.

With the above, a semiconductor device 1 in the present embodiment constructed by flip-chip connecting the semiconductor chip 50 to the connection pads 22 of the wiring substrate 10 is obtained. In the present embodiment, even though a design rule of the wiring substrate is identical, the wiring substrate equipped with the connection pads having a narrower pitch than that in the prior art can be easily designed. As a result, a semiconductor device on which the higher-performance semiconductor chip is mounted can be manufactured at a low cost.

(Second Embodiment)

Figure 12:
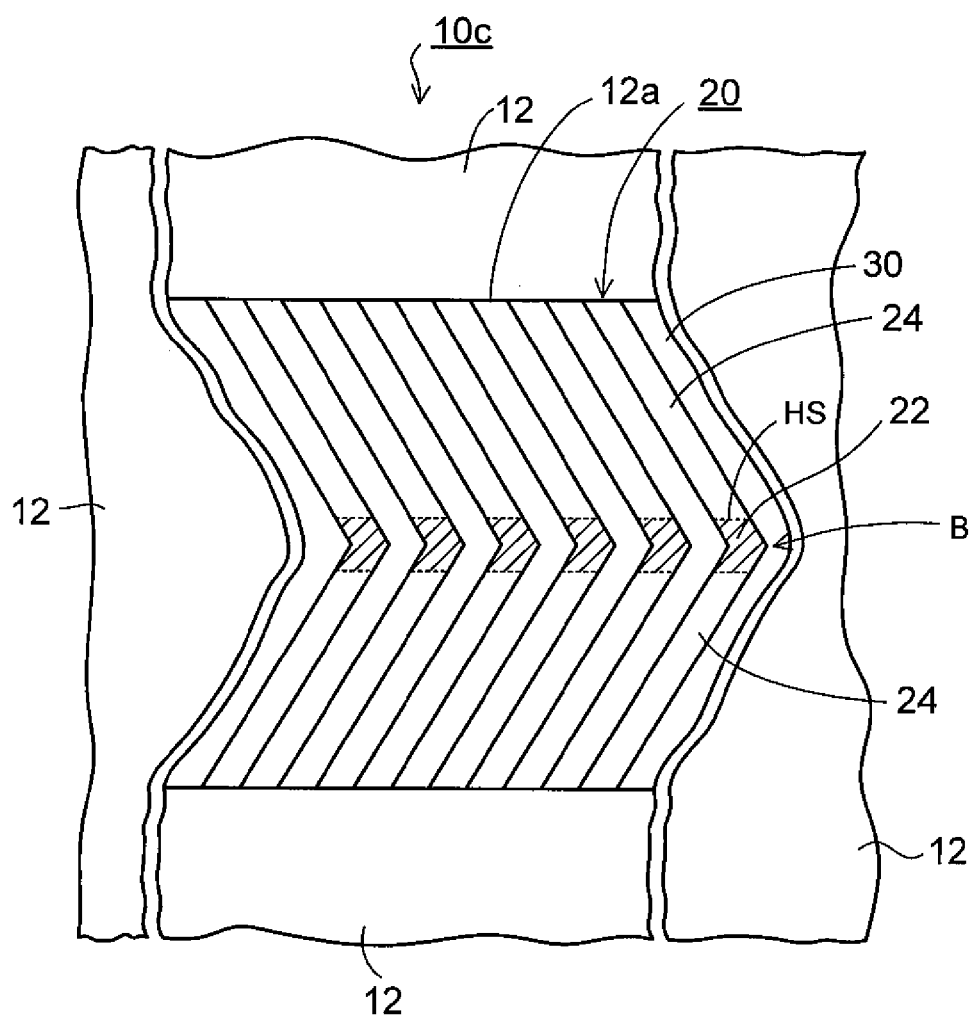
FIG. 12 is a plan view showing connection pads of a wiring substrate according to a second embodiment of the present invention.

FIG. 12 is a plan view showing a wiring substrate according to a second embodiment of the present invention. In the above first embodiment, the connection pad 22 of the wiring substrate 10 is a rectangle having the length L, and the leading wiring portion 24 is connected to be bended to the upper and lower sides of the connection pad 22.

As shown FIG. 12, in a wiring substrate 10c of the second embodiment, a plurality of leading wiring portions 24 are arranged in the opening portion 12a of the solder resist 12. Also, the leading wiring portions 24 arranged at the upper and lower sides are connected mutually via the bending portion B respectively, and the bending portions B constitutes the connection pad 22 (shaded portion) respectively. In the second embodiment, the leading wiring portion 24 is inclined from the horizontal sides HS of upper and lower portions of the connection pad 22 with a predetermined bending angle, and is connected to the connection pad 22, thus the leading wiring portion 24 is bended from the connection pad 22.

Since remaining elements are identical to those of the first embodiment in FIG. 3, their explanation will be omitted herein by affixing the same reference symbols.

In the second embodiment, like the first embodiment, the solder is formed on the connection pad 22 (bending portion B) and the leading wiring portion 24, and the reflow heating is applied to the solder. Accordingly, the solder on the leading wiring portion 24 moves toward the bending portion B side, and as a result, the solder layer having a sufficient volume is formed to protrude upward on the connection pad 22 arranged in the bending portion B.

The second embodiment can achieve the similar advantages to those in the first embodiment.

What is claimed is:

1. A wiring substrate, comprising:
   a plurality of connection pads and leading wiring portions connected to said plurality of connection pads respectively, arranged on an upper surface of an insulating layer,
   wherein the leading wiring portions are arranged to be bended, and
   wherein the connection pads are located from or at a bending portion of the leading wiring portions such that the connection pads have a width x that is substantially at most a width y of the corresponding leading wiring portion thickened by a length z corresponding to a bending angle $\theta$ of the bending portion, such that $y+z=x=y/\cos\theta$;
   wherein a side of the connection pads adjacent to the lead wiring portions forms a side opposing a right angle part of a rectangular triangle for defining the $\cos\theta$,
   and a length of the side opposing the right angle part is equal to the width x of the connection pad, and a length of a side of said rectangular triangle that extends between the $\theta$ angle and the right angle is equal to the width y of the leading wiring portion; and
   a solder layer is provided on the connection pads and protrudes upward from an upper surface of the connection pads.

2. A wiring substrate according to claim 1, wherein the leading wiring portions are connected to both end sides of the connection pads which are rectangular respectively.

3. A wiring substrate according to claim 1, wherein the solder layer on the connection pad is formed by concentrating a solder formed on the connection pads and the leading wiring portions onto the connection pads with a reflow heating.

4. A wiring substrate according to claim 1, wherein a protection insulating layer is formed on the upper surface of the insulating layer, and the connection pads and leading wiring portions are exposed to an opening portion provided in the protection insulating layer.

5. A wiring substrate according to claim 1, wherein the bending angle $\theta$ ranges from 20° to 36.5°.

6. A wiring substrate, comprising:
   a plurality of connection pads and leading wiring portions connected to said plurality of connection pads respectively, arranged on an upper surface of an insulating layer, wherein the leading wiring portions are arranged to be bended, and wherein the connection pads are located from or at a bending portion of the leading wiring portions such that the connection pads have a width x that is substantially at most a width y of the corresponding leading wiring portion thickened by a length z corresponding to a bending angle θ of the bending portion, such that y+z=x=y/cos θ;

a length of the side opposing a right angle part of a rectangular triangle for defining the cos θ is equal to the width x of the connection pad, and a length of a side of said rectangular triangle that extends between the θ angle and the right angle is equal to the width y of the leading wiring portion;

the bending angle θ ranges from 20° to 36.5°; and a solder layer is provided on the connection pads and protrudes upward from an upper surface of the connection pads.

7. A wiring substrate according to claim 6, wherein the leading wiring portions are connected via a bending portion respectively, and the bending portion constitutes the connection pad.

8. A semiconductor device, comprising:

the wiring substrate set forth in any one of claims 1 to 3 and 7, and a semiconductor chip whose bumps are joined to the connection pads of the wiring substrate by bonding to the solder layer.

9. A wiring substrate according to claim 6, wherein the leading wiring portions are connected to both end sides of the connection pads which are rectangular respectively.

10. A wiring substrate according to claim 6, wherein the solder layer on the connection pad is formed by concentrating a solder formed on the connection pads and the leading wiring portions onto the connection pads with a reflow heating.

11. A wiring substrate according to claim 6, wherein a protection insulating layer is formed on the upper surface of the insulating layer, and the connection pads and leading wiring portions are exposed to an opening portion provided in the protection insulating layer.

12. A wiring substrate, comprising:

a plurality of connection pads and leading wiring portions connected to said plurality of connection pads respectively, arranged on an upper surface of an insulating layer, wherein the plurality of connection pads and leading wiring portions each have straight edges on two outer peripheries in their respective width directions;

wherein the leading wiring portions are bended;

the connection pads are located from or at a bending portion of the leading wiring portions such that the connection pads have a width x that is substantially at most a width y of the corresponding leading wiring portion thickened by a length z corresponding to a bending angle θ of the bending portion, such that y+z=x=y/cos θ, each of the straight edges of the connection pads connecting directly between corresponding straight edges of the corresponding leading wiring portions;

a length of a side opposing a right angle part of a rectangular triangle for defining the cos θ is equal to the width x of the connection pad, and a length of a side of said rectangular triangle that extends between the θ angle and the right angle is equal to the width y of the leading wiring portion; and a solder layer is provided on the connection pads and protrudes upward from an upper surface of the connection pads.

* * * * *